United States Patent [19]
McClure et al.

[11] Patent Number: 5,644,542
[45] Date of Patent: Jul. 1, 1997

[54] STRESS TEST FOR MEMORY ARRAYS IN INTEGRATED CIRCUITS

[75] Inventors: David Charles McClure, Carrollton; James Brady, Dallas, both of Tex.

[73] Assignee: SGS-Thomson Microelectronics, Inc., Carrollton, Tex.

[21] Appl. No.: 460,409

[22] Filed: Jun. 2, 1995

Related U.S. Application Data

[63] Continuation of Ser. No. 954,276, Sep. 30, 1992, Pat. No. 5,424,988.

[51] Int. Cl.$^6$ .................................... G11C 7/00
[52] U.S. Cl. ........................ 365/201; 365/189.09
[58] Field of Search ........................ 365/201, 202, 365/189.01, 189.09

[56] References Cited

U.S. PATENT DOCUMENTS

| | | | |
|---|---|---|---|
| 4,301,535 | 11/1981 | McKenny et al. | 365/185 |
| 4,342,103 | 7/1982 | Higuchi et al. | 365/201 |
| 4,651,304 | 3/1987 | Takata | 365/201 |
| 4,751,679 | 6/1988 | Dehganpour | 365/542 |
| 5,046,049 | 9/1991 | Choi | 365/201 |
| 5,086,413 | 2/1992 | Tsuboi | 365/201 |
| 5,208,778 | 5/1993 | Kumanoya et al. | 365/201 |
| 5,258,954 | 11/1993 | Furuyama | 365/201 |
| 5,276,647 | 1/1994 | Matsui | 365/201 |
| 5,424,988 | 6/1995 | McClure et al. | 365/201 |

FOREIGN PATENT DOCUMENTS

| | | |
|---|---|---|
| 0101107 | 2/1984 | European Pat. Off. . |
| 0313882A2 | 10/1988 | European Pat. Off. . |
| 0405576 | 1/1991 | European Pat. Off. . |

OTHER PUBLICATIONS

IBM Technical Disclosure Bulletin, "Fast method used to stress and test FET memory arrays". v 29, No. 12 (1987).

*Primary Examiner*—A. Zarabian
*Attorney, Agent, or Firm*—Theodore E. Galanthay; Lisa K. Jorgenson; Renee M. Larson

[57] ABSTRACT

A method for stress testing a memory array in an integrated circuit. Control circuitry selects a plurality of row lines at one time. An overvoltage suitable for stressing the cells of the array is placed on the bit lines. Because a block of cells has been selected, the overvoltage is applied to all cells of the block. The block of cells selected may be either the entire memory array or a portion of the memory array. The selected rows remain selected for the duration of the stress test. Because the overvoltage is applied directly to selected cells, the full overvoltage will be used to stress the transistor gates for the entire test period. In this manner, latent defects within the memory array can be detected.

9 Claims, 1 Drawing Sheet

STRESS TEST FOR MEMORY ARRAYS IN INTEGRATED CIRCUITS

This is a continuation of Ser. No. 07/954,276, filed Sep. 30, 1992, now U.S. Pat. No. 5,424,988.

BACKGROUND OF THE INVENTION

1. Field of the Invention

The present invention relates in general to integrated circuits, and more particularly to memory arrays in integrated circuits. Still more particularly, the present invention relates to a method for stress testing a memory array.

2. Description of the Prior Art

Stress testing of memory arrays is typically accomplished by applying an overvoltage to the gates of the transistors in the array. To perform this test, it is typical to apply the overvoltage to all of the bit and complementary bit lines, and then sequentially activate each word line in the memory. In this manner, a stress voltage is applied to every cell in the array.

This method of stress testing a memory array has several problems. First, the amount of time available to stress a memory cell is limited to the amount of time a word line is activated. As each of the word lines are sequentially activated, a memory cell is stressed for only the amount of time its corresponding word line is activated.

Second, if latent defects exist in the memory array, this method of stress testing may not detect all the defects. This is due to charge leakage through a marginal defect. Once the memory cell has stored the overvoltage, current leakage may occur and lower the voltage stored in the cell. Although some of the lost charge can be replaced by current flowing through the load element, the amount of replaced charge may be less than the charge lost. This is especially true in low power memory cells because the load resistor is very large, typically a teraohm, so very little current will flow through the resistor. Consequently, the voltage in the memory cell is not maintained at the stress level for the proper amount of time, and marginal cells may survive the stress test. This allows latent defects in the memory cell to go undetected, resulting in the production of marginal memory arrays.

Therefore, it would be desirable to provide a method for stress testing a memory array where the memory cells are maintained at the stress voltage level for the proper amount of time. It is also desirable that such a method not increase the complexity of the fabrication of integrated circuit.

SUMMARY OF THE INVENTION

A technique is provided for stress testing a memory array in an integrated circuit. Control circuitry selects a plurality of row lines at one time. An overvoltage suitable for stressing the cells of the array is placed on the bit lines. Because a block of cells has been selected, the overvoltage is applied to all cells of the block. The block of cells selected may be either the entire memory array or a portion of the memory array. The selected rows remain selected for the duration of the stress test. Because the overvoltage is applied directly to selected cells, the full overvoltage will be used to stress the transistor gates for the entire test period. In this manner, latent defects within the memory array can be detected.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
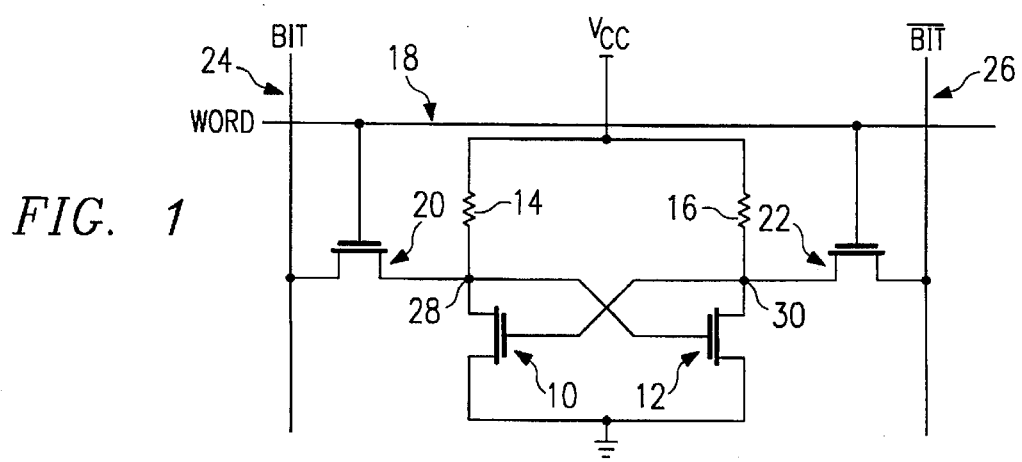
FIG. 1 is a circuit diagram illustrating a memory cell within a memory array.

Referring to FIG. 1, a circuit diagram of a memory cell is illustrated. As can be seen, a first transistor 10, a second transistor 12, a first load element 14, and a second load element 16 are arranged in a flip-flop configuration. In the preferred embodiment, load elements 14, 16 are resistors, but those skilled in the art will recognize that p-channel transistors may also be used for load elements 14, 16.

Row line 18, labeled word, is connected to the gate of a third transistor 20 and fourth transistor 22. Row line 18 is utilized to activate the cell. Signal lines 24, 26 labeled bit and bit bar, respectively, are then utilized to store data to and read data from the cell. In this manner, third and fourth transistor 20, 22 act as select transistors, and first transistor 10 and second transistor 12 are storage transistors.

Data is stored as voltage levels with the two sides of the flip-flop in opposite voltage configurations. The memory cell has two stable states, high or logic 1, and low or logic 0. If the memory cell is storing a logic 1, node 28 is high and node 30 is low, with first transistor 10 turned off and second transistor 12 turned on. The logic 0 state would be the opposite, with node 28 low and node 30 high.

Figure 2:
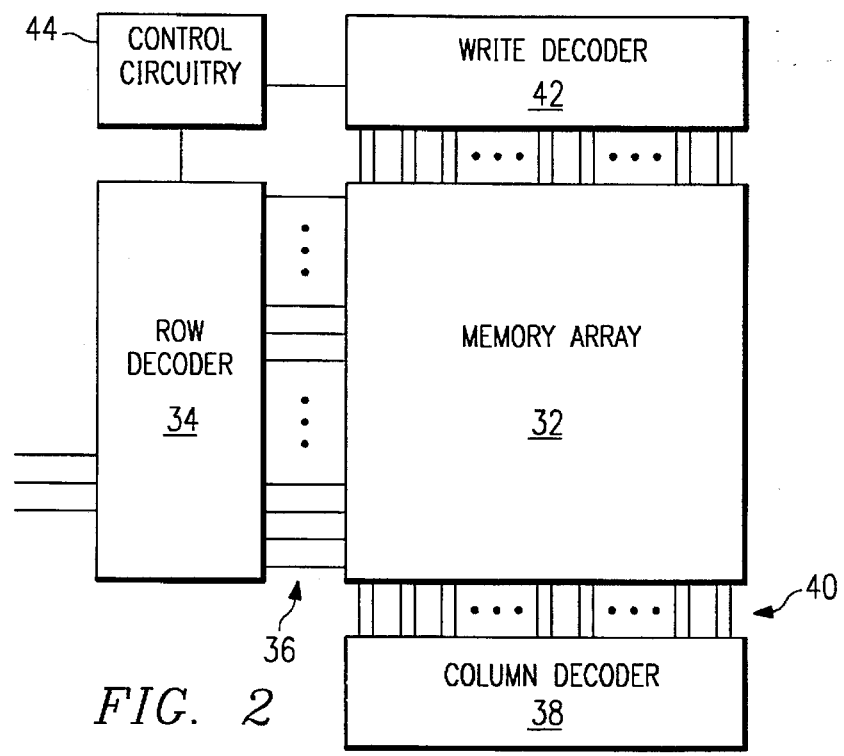
FIG. 2 is a block diagram illustrating a portion of the circuitry in a memory integrated circuit.

The memory cell illustrated in FIG. 1 is imbedded in an array of similar cells. FIG. 2 is a block diagram of the circuitry associated with a memory array in an integrated circuit according to the present invention. Memory array 32 is accessed by a row decoder 34 which selects a word line from a plurality of word lines 36. A column decoder 38 selects the appropriate bit and bit bar lines from a plurality of bit and bit bar lines 40. Write decoder 42 is utilized to write data into the memory array 32. Although column decoder 38 and write decoder 42 are depicted as separate circuits, those skilled in the art will recognize that column decoder 38 and write decoder 42 may be combined in one circuit.

As known in the prior art, stress testing of the memory array is accomplished by selecting one word line at a time within the memory array. An overvoltage, typically seven volts, is applied from $V_{cc}$ to all of the bit and complementary bit lines, while each word line in the memory is sequentially activated. In this manner, a stress voltage is applied to every cell in the array.

This method of stress testing may not detect all the defects which exist in the array. This is due to charge leakage through a marginal defect. For example, with reference to FIG. 1, a charge is stored in the memory cell at node 28. Current may leak through the gate of transistor 12 and lower the charge stored in the cell. Although some of the lost charge can be replaced by current flowing through the load element 14, the amount of replaced charge may be less than the charge lost. Consequently, the charge in the memory cell is not maintained at the stress level for the proper amount of time, and marginal cells may survive the stress test. This allows latent defects in the memory cell to go undetected, resulting in the production of marginal memory arrays.

A technique for stress testing a memory array according to the present invention will now be described. Referring now to FIG. 2, block 44 represents control circuitry which generates a control signal utilized by row decoder 34 and write decoder 42. The control signal from block 44 causes row decoder 34 to select all or a portion of the word lines at one time. The selected word lines remain activated for the duration of the stress test. The control signal from block 44 is also utilized by the write decoder 42 to set all or a portion of the bit lines in the array to a high voltage level, usually seven volts, and all or a portion of the bit line bars to a low voltage level. After a predetermined amount of time, the voltage levels are switched, with all the bit lines in the array set to a low voltage level and all the bit line bars set to a high voltage level. By applying the overvoltage through control circuitry 44 to bit lines and complementary bit lines, instead of from $V_{cc}$ through load elements 14, 16, the overvoltage level is maintained throughout the duration of the stress test and completely stresses first and second transistors 10, 12. By stress testing the memory array in the manner, latent defects within memory cells can be detected.

If current transients are a concern, it is possible to begin the stress test with $V_{cc}$ set at a low voltage level, and then ramp up $V_{cc}$ to a desired level. This would reduce current transients. Furthermore, alternative methods for stress testing the array could be utilized. In one alternative method, only portions of the array are selected and tested at one time. For example, some of the word lines may be selected at one time, perform the test on the memory cells associated with those word lines, and then select another group of word lines. This process continues until the entire array of memory cells has been tested. Depending on how the row decoder is set up, another alternative is to select the word lines in one quadrant of the array and test the quadrant, then move onto the next quadrant. This would also minimize current transients.

Figure 3:
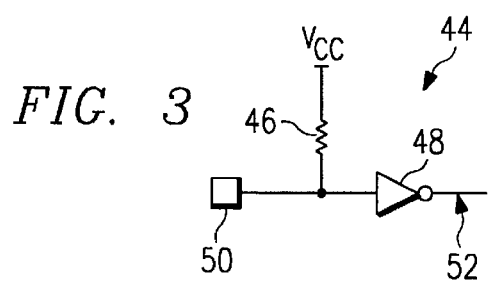
FIG. 3 is a circuit diagram illustrating a test mode pin circuit utilized in testing a memory array according to the present invention.

FIG. 3 is a circuit diagram illustrating a test mode pin circuit for stress testing a memory array according to the present invention. Resistor 46 is connected to $V_{cc}$ and is an input into inverter 48. Input pad 50 is also input into inverter 48. The test mode circuit 44 illustrated in FIG. 3 allows the memory array to be stress tested while at the wafer level of fabrication of an integrated circuit. A probe can ground input pad 50, causing the output line 52 of inverter 48 to go high. Output line 52 may be, for example, an additional input into a gate. A high voltage level on output 52 may be utilized to activate all of the word lines within the memory array at one time. It is possible, however, to utilize this method of stress testing a memory array at other steps along the fabrication process or once the memory array is packaged. For example, a test pin in the packaged integrated circuit may be utilized to stress test the memory array. Typically, the test mode can be entered using a selected over or under voltage, or a patterned input signal, as known in the art.

An alternative method for stress testing a memory array will now be described with reference to FIGS. 1–2. As described above, the control signal from block 44 causes row decoder 34 to select all or a portion of the word lines at one time. The selected word lines remain activated for the duration of the stress test. The control signal from block 44 is also utilized by the write decoder 42 to set all or a portion of the bit lines in the array to a high voltage level, usually seven volts, while voltage level on the bit line bars is allowed to float. The bit line bars will then be pulled to a low voltage by the memory cells. After a predetermined amount of time, the voltage levels are switched, with all the bit line bars set to a high voltage level and the bit lines floating. As before, the bit lines will be pulled low by the memory cells.

Furthermore, a method for stressing select transistors 20, 22 involves writing data into a memory cell, preferably at a high voltage. In a first part of the stress procedure, a one is written to each cell. This may be done for all cells simultaneously, or one row at a time. After writing the data, node 28 and signal line 24 are high, and node 30 signal line 26 are low. The word line 18 is then not activated. The voltage levels on the bit lines and complementary bit lines are then switched, so that the data on the bit lines is complementary to that stored in the cells. This creates a voltage stress across the select transistors 20, 22, allowing marginal select transistors to be ferreted out. The procedure can be repeated using complementary data written into the memory cells, causing both select transistors 20, 22 to be stressed in both directions.

Those skilled in the art will recognize that the invention provides a method for stress testing a memory array which maintains an overvoltage on the memory cells so that latent defects within the array are detected. Furthermore, the stress test described above does not significantly increase the complexity of the fabrication process.

While the invention has been particularly shown and described with reference to a preferred embodiment, it will be understood by those skilled in the art that various changes in form and detail may be made therein without departing from the spirit and scope of the invention.

What is claimed is:

1. A method for testing an array of memory cells in an integrated circuit, comprising the steps of:

selecting a plurality of word lines of the integrated circuit simultaneously, wherein said array of memory cells is selected and the plurality of word lines selected remain activated for the duration of a stress test of said array of memory cells; and applying a stress voltage to a plurality of bitlines of the array of memory cells for the duration of the stress test.

2. A circuit of an integrated circuit memory device for stress testing an integrated circuit memory device, comprising:

a memory array of the integrated circuit memory device;

a plurality of word lines of the memory array;

a plurality of bit lines of the memory array comprised of a plurality of bit lines true and a plurality of bit lines complement;

a row decoder coupled to the plurality of word lines of the memory array;

a column and write decoder coupled to the memory array which controls the plurality of bit lines of the memory array and allows data to be written into the memory array; and a control circuit which generates a control signal that controls the row decoder and the column and write decoder;

wherein the control signal generated by the control circuit causes the row decoder to simultaneously select at least a portion of the plurality of word lines which remain activated for the duration of a stress test of the memory array; and wherein during a first predetermined period of time of the stress test the control signal generated by the control circuit causes the write decoder to set at least a portion of the plurality of bit lines true to a first voltage level and to set at least a portion of the plurality of bit lines bar to a second voltage level, and wherein during a second predetermined period of time of the stress test the control signal generated by the control circuit causes the write decoder to set the at least a portion of the plurality of bit lines true to the second voltage level and to set the at least a portion of the plurality of bit lines bar to the first voltage level.

3. The circuit of claim 2, wherein the first voltage level is an overvoltage level and the second voltage level is a low voltage level.

4. The circuit of claim 2, wherein the control signal generated by the control circuit causes the row decoder to simultaneously select the plurality of word lines which remain selected for the duration of a stress test of the memory array.

5. A circuit of an integrated circuit memory device for stress testing an integrated circuit memory device, comprising:

a memory array of the integrated circuit memory device;

a plurality of word lines of the memory array;

a plurality of bit lines comprised of a plurality of bit lines true and a plurality of bit line bars of the memory array;

a row decoder coupled to the plurality of word lines of the memory array;

a column decoder coupled to the plurality of bit lines of the memory array;

a write decoder coupled to the memory array which controls writing data into the memory array; and a control circuit which generates a control signal that controls the row decoder and the write decoder, wherein the control signal generated by the control circuit causes the row decoder to simultaneously select at least a portion of the plurality of word lines which remain activated for the duration of a stress test of the memory array; and wherein during a first predetermined period of time of the stress test the control signal generated by the control circuit causes the write decoder to set at least a portion of the plurality of bit lines true to a first voltage level and to set at least a corresponding portion of the plurality of bit line bars to a second voltage level, and wherein during a second predetermined period of time of the stress test the control signal generated by the control circuit causes the write decoder to set the at least a portion of the plurality of bit lines true to the second voltage level and to set the at least a portion of the plurality of bit lines bar to the first voltage level.

6. The circuit of claim 5, wherein the first voltage level is an overvoltage level and the second voltage level is a low voltage level.

7. The circuit of claim 5, wherein the control signal generated by the control circuit causes the row decoder to simultaneously select the plurality of word lines which remain selected for the duration of a stress test of the memory array.

8. A method for testing an array of memory cells in an integrated circuit, comprising the steps of:

generating a control signal that controls a row decoder and a column and write decoder of the integrated circuit;

selecting a plurality of word lines of the integrated circuit simultaneously in response to control of the row decoder by the control signal, wherein said array of memory cells is selected and the plurality of word lines selected remain activated for a duration of a stress test of said array of memory cells; and applying a stress voltage to a plurality of bit lines of the array of memory cells for the duration of the stress test in response to control of the column and write decoder by the control signal.

9. A method for testing an array of memory cells in an integrated circuit, comprising the steps of:

generating a control signal that controls a row decoder and a column and write decoder of the integrated circuit;

selecting a plurality of word lines of the integrated circuit simultaneously in response to control of the row decoder by the control signal, wherein said array of memory cells is selected and the plurality of word lines selected remain activated for the duration of a stress test of said array of memory cells; and applying a stress voltage to a plurality of bit lines of the array of memory cells during the stress test in response to control of the column and write decoder by the control signal, wherein during a first predetermined period of time of the stress test the control signal generated by the control circuit causes the column and write decoder to apply the stress voltage to a plurality of bit lines true of the plurality of bit lines to a first voltage level and to apply a non-stress voltage to a plurality of bit lines bar of the plurality of bit lines, and wherein during a second predetermined period of time of the stress test the control signal generated by the control circuit causes the write decoder to apply the non-stress voltage to the plurality of bit lines true and to apply the stress voltage to the plurality of bit lines bar.

* * * * *